United States Patent
Hosomi

(10) Patent No.: US 7,817,439 B2
(45) Date of Patent: Oct. 19, 2010

(54) SYSTEM AND APPARATUS FOR POWER DISTRIBUTION FOR A SEMICONDUCTOR DEVICE

(75) Inventor: Eiichi Hosomi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 874 days.

(21) Appl. No.: 11/474,811

(22) Filed: Jun. 26, 2006

(65) Prior Publication Data

US 2007/0297156 A1     Dec. 27, 2007

(51) Int. Cl.
*H05K 1/18* (2006.01)
(52) U.S. Cl. .................. 361/763; 361/764; 361/784
(58) Field of Classification Search ......... 361/760–764, 361/782–784; 307/30, 147
See application file for complete search history.

(56) References Cited

U.S. PATENT DOCUMENTS

| | | | | |
|---|---|---|---|---|
| 5,400,086 A | * | 3/1995 | Sano et al. .................. | 348/678 |
| 5,491,624 A | * | 2/1996 | Levran et al. ................. | 363/87 |
| 6,606,012 B2 | * | 8/2003 | Novak ......................... | 333/17.3 |
| 6,631,061 B2 | * | 10/2003 | Okawa ......................... | 361/56 |
| 6,657,318 B2 | * | 12/2003 | Ishikawa et al. ............. | 307/30 |
| 6,753,836 B2 | * | 6/2004 | Kwon .......................... | 345/87 |
| 7,190,143 B2 | * | 3/2007 | Wei et al. .................... | 318/606 |

OTHER PUBLICATIONS

Pham et al., "Electrical Characterization and Modeling Technique for Substrate Designs", 6 pages, 2005.

* cited by examiner

*Primary Examiner*—Tuan T Dinh
(74) *Attorney, Agent, or Firm*—Sprinkle IP Law Group

(57) ABSTRACT

Systems, methods and apparatuses for low noise power distribution networks for use with semiconductor devices are disclosed. Embodiments of these systems and methods provide a power distribution network comprising a set of individual power distribution networks, each of the individual power distribution networks operable to provide power to a corresponding functional block of the semiconductor device. These individual power distribution networks may be coupled through capacitors between the power supplies or grounds of each individual power distribution network, such that the individual power distribution networks are coupled in a manner operable to pass AC current between them.

9 Claims, 10 Drawing Sheets

SYSTEM AND APPARATUS FOR POWER DISTRIBUTION FOR A SEMICONDUCTOR DEVICE

TECHNICAL FIELD OF THE INVENTION

The invention relates in general to methods and systems for power distribution in semiconductor devices and printed circuit boards, and more particularly, to low noise power distribution networks for use with a semiconductor device.

BACKGROUND OF THE INVENTION

With the advent of the computer age, electronic systems have become a staple of modern life, and some may even deem them a necessity. Part and parcel with this spread of technology comes an ever greater drive for more functionality from these electronic systems. A microcosm of this quest for increased functionality is the size and capacity of various semiconductor devices. From the 8 bit microprocessor of the original Apple I, through the 16 bit processors of the original IBM PC AT, to the current day, the processing power of semiconductors has grown while the size of these semiconductors has consistently been reduce. In fact, Moore's law recites that the number of transistors on a given size piece of silicon will double every 18 months.

As semiconductors have evolved into these complex systems, almost universally the connectivity and power requirements for these semiconductors have been increasing. In fact, the higher the clock frequency utilized with a semiconductor, the greater that semiconductor's power consumption (all other aspects being equal). Part and parcel, however, with the increase in power consumption and operating frequency is the countervailing tendency toward reduced operating voltages in semiconductors and thus, tighter noise budgets. As can be seen then, these requirements may be at odds with one another to a certain extent. In particular, increasing the power consumption of a semiconductor device usually results in more switching noise, which is less than desirable given a tighter noise budget.

Turning briefly to FIG. 1, one example of a semiconductor package 100 is depicted. Die 110 comprising an integrated circuit, such as a microprocessor, is attached to substrate 120. Ball grid array (BGA) balls 130 serve to couple die 110 to one or more power sources or signal input/output lines. Typically substrate 120, with which microprocessors or semiconductors are packaged, is made of organic material (such as epoxy resin). Substrate 120 may be fabricated using build-up technology, which enables higher wiring capability by having fine-line build-up layer(s) on both sides of a coarser core substrate. Typically, these layers or planes of substrate 120 are coupled to BGA balls 130 through the use of vias. These BGA balls 130 may then be coupled to a printed circuit board (PCB) which comprises, or is coupled to, one or more power supplies.

FIG. 2 depicts an embodiment of this type of power distribution network in more detail. Power supply 210 is coupled to PCB 220 in close proximity to one or more sides of package 100 open for a power distribution network. Current flows from power supply 210, through layers of PCB 220, to area of PCB 220 where balls 130 of BGA are coupled, through vias (not shown) attached to BGA balls 130 to planes of substrate 120 and eventually to die 110.

Package 100, and PCB 200 to which package 100 is coupled, may be composed of build-up layers, where one side of package 100 is utilized for a power distribution network. These layers may consist of planes in package 100 and layers comprising PCB 220 to which package 100 is attached. Power supply module 210 may supply current to die 110 (or an area of die 110) in the center of package 100. This current may pass from PCB 220 through plate through holes (PTHs) in the layers of PCB 220 to BGA balls 130 of package 110; current can then flow from BGA balls 130 to die 110 through planes of package 100 coupled to vias, which are, in turn, coupled to BGA balls 130.

As the functionality of the semiconductor device on die 110 increases, many functional blocks may be embedded in the semiconductor device. Each of these functional blocks (e.g. processor cores, register memory, different arithmetic logic units, controllers, etc.) may have different power requirements. In other words each functional block of logic may utilize a different operating voltage. In this case, the power distribution network associated with some of these functional blocks may be separate in die 110, package 100 or PCB 220 utilized in conjunction with package 100. In other words, the power supplies, lines, planes, vias etc. utilized to deliver power to one functional block of die 110 may be distinct from similar components utilized to deliver power to another functional block of die 110.

Recently, however, a new architecture has been developed for computer processors. Known as a multi-core architecture, this processor architecture may be comprised of multiple processor cores interconnected by an inter-chip bus. In cases such as this, if similar processor cores are utilized the power requirements for each of these processor cores may be substantially similar. As may be imagined, then, in such multi-core architectures it may not be necessary to have a distinct power distribution network for each of these processor cores. In fact, each of the processor cores of a multi-core architecture may share a power supply through a common power distribution network.

In many cases, however, use of shared power distribution networks in conjunction with blocks of similar functionality in a semiconductor device may result in undesirable switching noise in cases where one or more of the functional blocks is not fully active, as power may continue to be supplied to basically inactive components. This undesirable switching noise may interfere with the operation of other components of the semiconductor device.

As can be seen then, what is desired is a low noise power distribution network for use with a semiconductor device, where such a power distribution network may be used to supply power to one or more functional blocks of the semiconductor device.

SUMMARY OF THE INVENTION

Systems, methods and apparatuses for low noise power distribution networks for use with semiconductor devices are disclosed. Embodiments of these systems and methods provide a power distribution network comprising a set of individual power distribution networks, each of the individual power distribution networks operable to provide power to a corresponding functional block of the semiconductor device. These individual power distribution networks may be coupled through capacitors between the power supplies or grounds of each individual power distribution network, such that the individual power distribution networks are coupled in a manner operable to pass AC current between them. As a result, switching noise of an individual power distribution network generated in conjunction with providing power to its corresponding functional block when it is active will be reduced when less than all the functional blocks coupled to the set of individual power distribution networks are active (relative to all the functional blocks being active).

In one embodiment, a set of individual power distribution networks are each coupled to a corresponding functional block of the semiconductor device and bypass capacitors couple the set of individual power distribution networks to one another.

In another embodiment, each of the individual power distribution networks may reside on, or in, a package comprising the semiconductor device, a printed circuit board (PCB) coupled to the package or the semiconductor device itself.

In still another embodiment, the bypass capacitors may reside in, or on, the semiconductor device, the PCB, or the package.

In yet another embodiment, the bypass capacitors may couple power lines of individual power distribution networks to one another or may couple ground lines of the individual power distribution networks to one another.

Embodiments of the present invention may allow the power delivered to a functional block of a semiconductor device to be individually controlled or regulated. Additionally, embodiments of the present invention may allow power from the power sources of other individual power distribution networks to be provided to functional blocks other than the functional block associated with those individual power distribution network. Thus, when a functional block is substantially inactive, the individual power distribution network corresponding to this inactive functional block may provide power to an active functional block corresponding to another individual power distribution network to which the individual power distribution network is coupled. This ability, in turn, reduces the switching noise of the individual power distribution network corresponding to the active functional block (e.g. relative to the switching noise generated by this individual power distribution network when only that individual power distribution network is supplying current to that functional block, for example when all the functional blocks are active).

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

Reference is now made in detail to the exemplary embodiments of the invention, examples of which are illustrated in the accompanying drawings. Wherever possible, the same reference numbers will be used throughout the drawings to refer to the same or like parts (elements).

Figure 1:
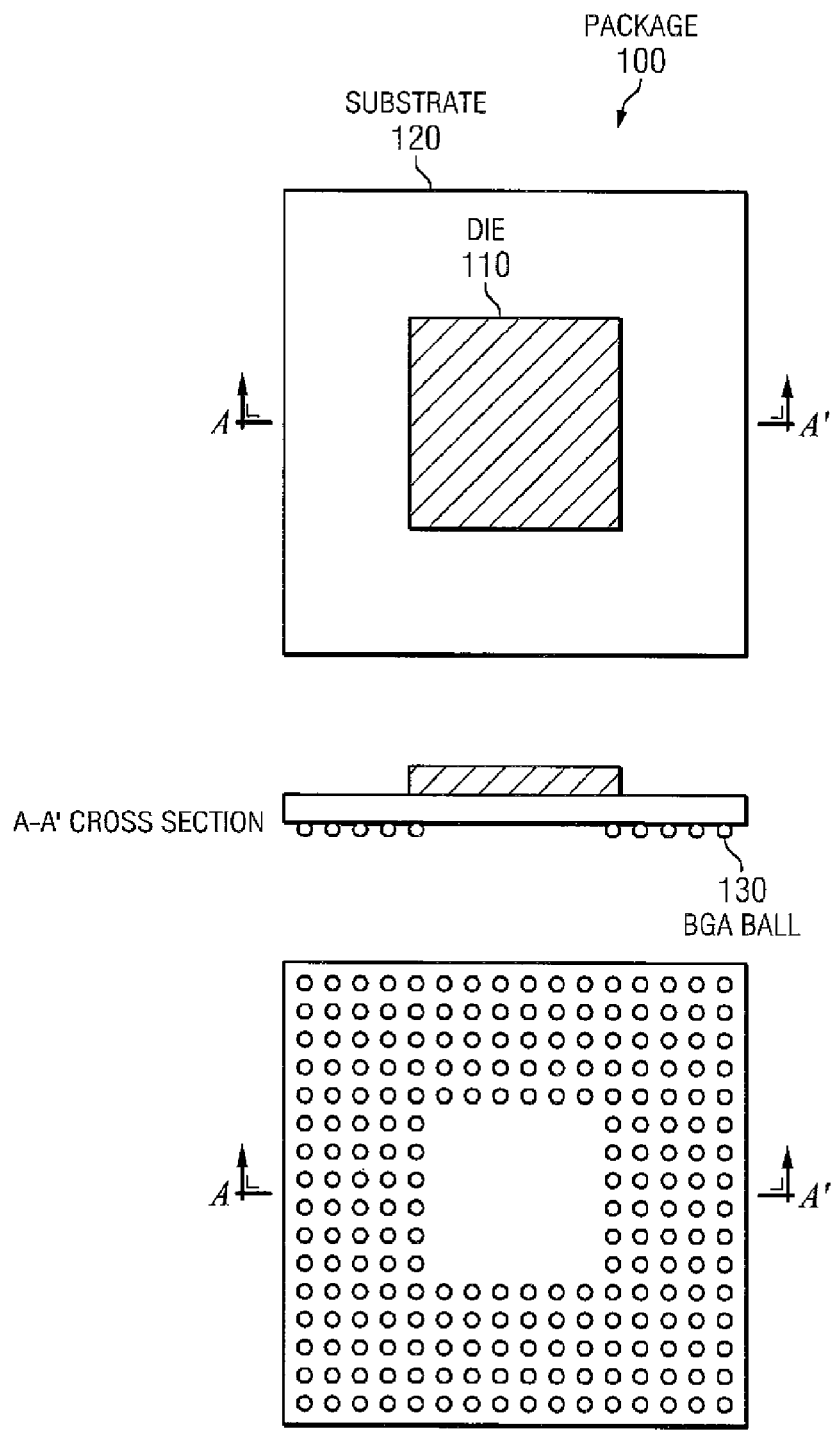
FIG. 1 depicts views of one embodiment of a semiconductor package including a semiconductor device.
Figure 2:
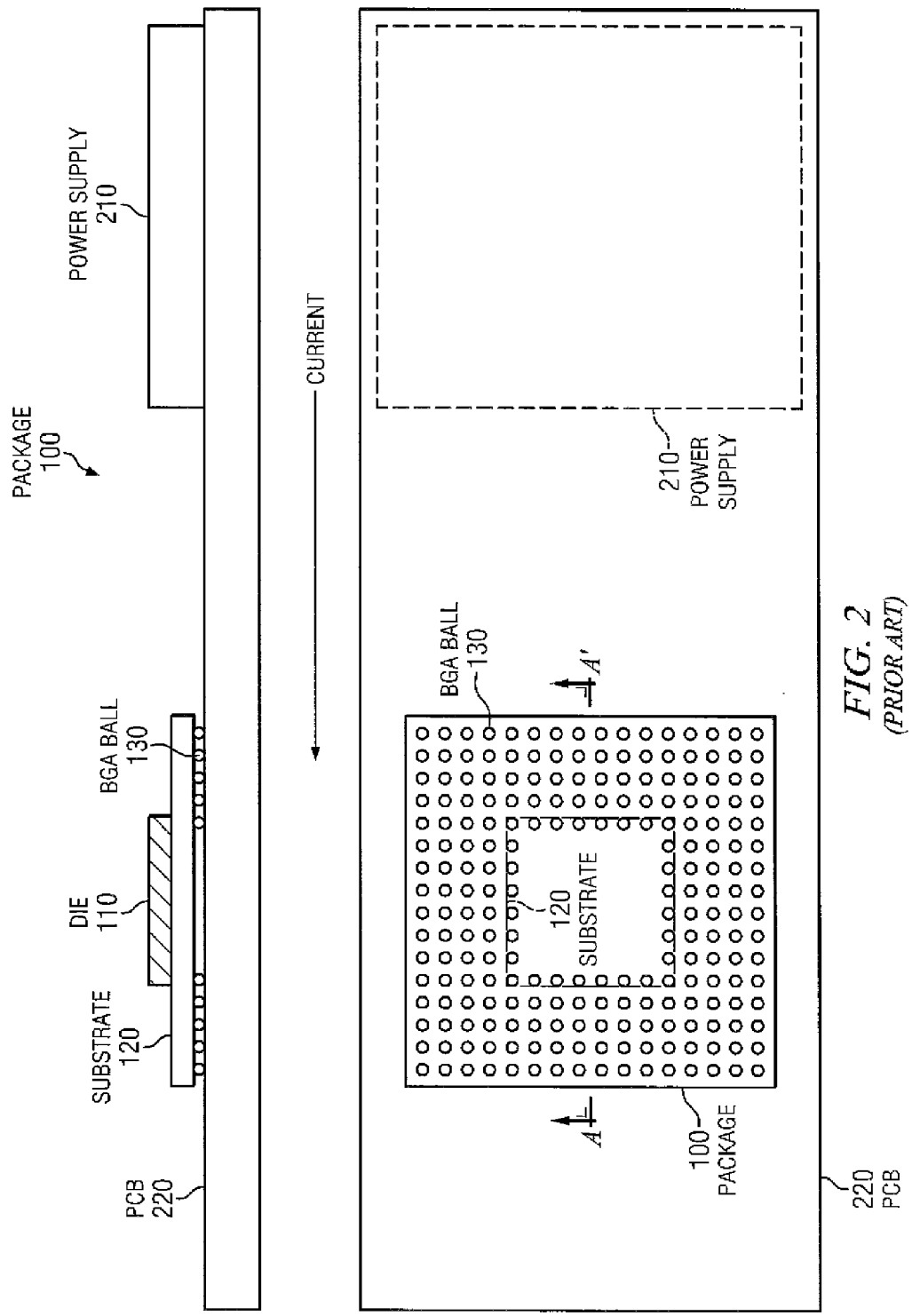
FIG. 2 depicts a high level view of one embodiment of components of a power distribution network for use with a semiconductor device.
Figure 3:
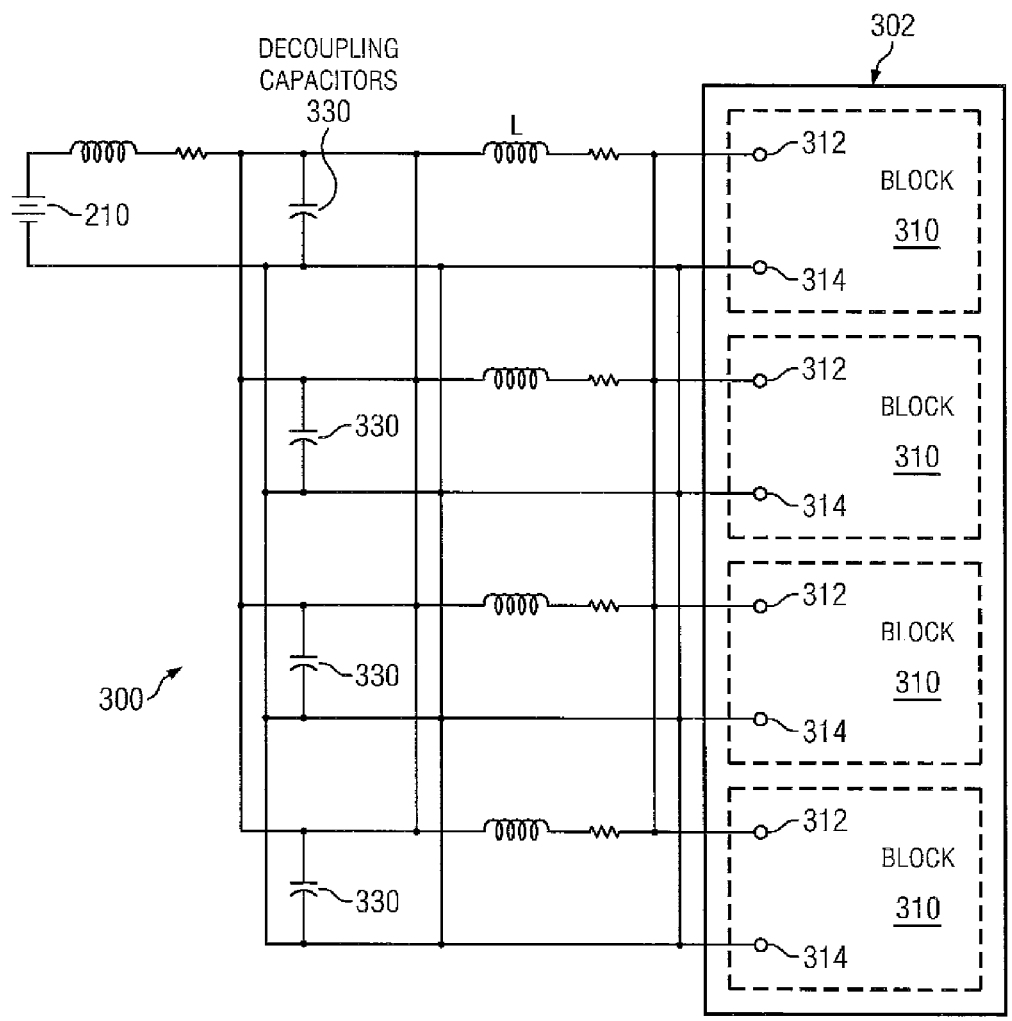
FIG. 3 depicts one embodiment of a power distribution network.

Before describing embodiments of the present invention it may be useful to describe exemplary architectures for power distribution network for use with semiconductor devices with multiple functional blocks (e.g. multi-core processors). FIG. 3 depicts a diagram of one example of just such a power distribution network and semiconductor device, where one power distribution network may be utilized with multiple functional blocks of a semiconductor device on die 110. Semiconductor device 302 (e.g. on die 110) comprises functional logic blocks 310 where, in one embodiment, each functional block 310 comprise substantially identical functional logic, such as, for example, a processor core.

Each of functional blocks 310 may have one or more power couplings 312 and one or more ground couplings 314 such that each of functional blocks 310 is coupled to a power source 210 through each of power couplings 312 and ground couplings 314 (e.g. each of power couplings 312 and ground couplings 314 are coupled to power distribution network 300 which comprises power supply 210). Each of ground couplings 314 may be coupled to power source 210 by, for example, using one or more lines or planes in substrate 120, vias of BGA balls 130 or ground planes in PCB 220, while each of power couplings 312 may be coupled to power source 210 using one or more lines in substrate 120, vias of BGA balls 130 or power planes in PCB 220.

As may be realized, package 100 (e.g. BGA balls 130 and vias coupled to BGA balls 130) and PCB 220 may present a certain inductance. This inductance, coupled with the distance of power supply 210 from functional blocks 310 may preclude power supply 210 from directly supplying alternating current (AC) power to functional blocks 310 in an efficient manner, as the switching noise (e.g. AC switching noise) generated by power distribution network 300 may correspond to the inductance presented between power source 210 and functional blocks 310.

Thus, power distribution network 300 may include decoupling capacitors 330 coupled between power couplings 312 and ground couplings 314 of functional block 310 (e.g. a decoupling capacitor may be coupled between BGA balls 130 or vias of BGA balls 130 coupled to a power coupling 312 or a ground coupling 314, or may be coupled between lines in substrate 120 coupling power coupling 312 or ground coupling 314 of functional block 310 of die 110 to vias of BGA balls, etc.). In this case, a substantial majority of AC power for the operation of functional blocks 310 may be supplied to functional blocks 310 from decoupling capacitors 330.

In this case, the switching noise generated along with current transitions may correspond to the inductance presented between each of the decoupling capacitors 330 and each function block 310 (e.g. if the functional block 310 is activated). Specifically, if current consumption in a functional block 310 changes from zero to di in time dt the switching noise of power distribution network 300 generated in conjunction with supplying power to a particular functional block 310 is $$L\frac{di}{dt}$$

where L is the inductance presented between the decoupling capacitor 330 supplying power to that functional block 310 and the functional blocks 310 itself. In other words, in the depiction of FIG. 3, if all functional blocks 310 are active, consuming substantially the same current, and the inductance presented between each decoupling capacitor 330 and each functional block 310 is substantially equal, the switching noise of power distribution network 300 generated in conjunction with supplying power to all pictured functional blocks 310 is $$L\frac{di}{dt}$$

where L is the inductance presented between each decoupling capacitor 330 and a corresponding functional block 310.

Figure 4:
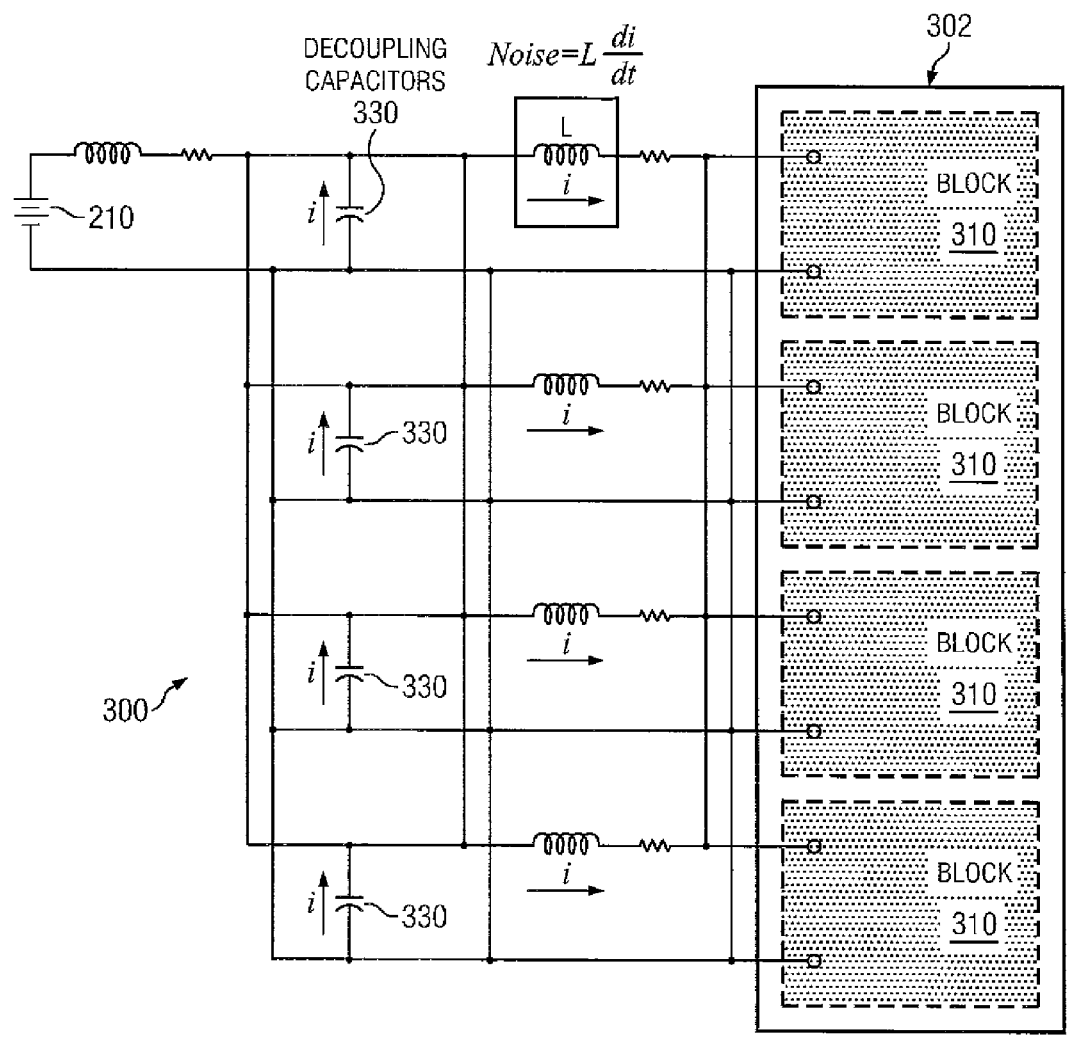
FIG. 4 depicts one embodiment of the power distribution network of FIG. 3 when all functional blocks are active.

The switching noise generated by power distribution network 300 may be better explained with reference to FIGS. 4 and 5. FIG. 4 depicts a diagram of power distribution network 300 with all functional blocks 310 of semiconductor 302 active and consuming current i, such that each decoupling capacitor 330 supplies current i to a corresponding functional blocks 310 and the switching noise of the of the power distribution network 300 generated in conjunction with supplying power to a particular functional block 310 is $$L\frac{di}{dt}.$$

Figure 5:
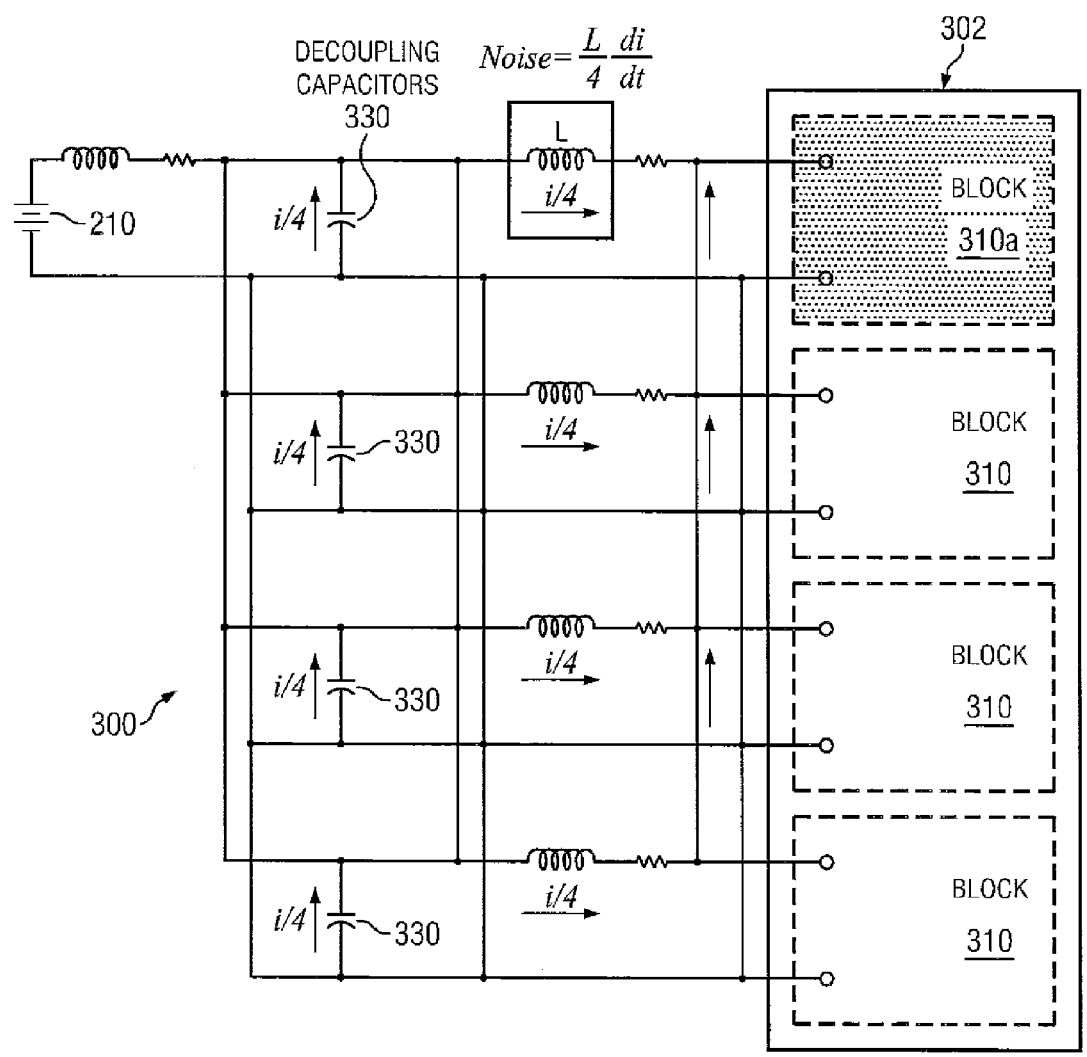
FIG. 5 depicts one embodiment of the power distribution network of FIG. 3 when one functional block is active.

In contrast, FIG. 5 depicts a diagram of power distribution network 300 when only a single function block 310a of semiconductor device 302 is active and consuming current i. Since power distribution network 300 (including decoupling capacitors 330) are coupled to all functional blocks 310 every decoupling capacitor 330 may supply at least a portion of the power being supplied to functional block 310a Assuming, in one particular instance, that each decoupling capacitor 330 is supplying approximately a fourth of the current $$\left(\text{e.g. } \frac{i}{4}\right)$$

being utilized by active functional block 330, power distribution network 300 generates switching noise $$\frac{L}{4}$$

in conjunction with supplying power to functional block 310a when only that functional block 310a is active, approximately a fourth of the switching noise generated in conjunction with supplying current to the same functional block 310a when all functional blocks 310 are active (as depicted in FIG. 4). As can be seen then, the switching noise generated by embodiments of power distribution networks like those depicted in FIGS. 4 and 5 may be basically linear (i.e. when one functional block 310a is active the switching noise generated in conjunction with supplying power to that functional block 310a may be approximately $$\frac{n}{x}th$$

the amount of noise generated in conjunction with that functional block 310a when n functional blocks 310 of semiconductor device 302 are active and the semiconductor devices 302 has x functional blocks 310 coupled to power distribution network 300).

When designing a power distribution network like that depicted in FIGS. 3, 4 and 5 for use with a semiconductor device then, the operation of the power distribution network may be designed such that the maximum noise generated by the power distribution network during operation of all functional blocks 310 may be less than a particular desired noise margin for that power distribution network. However, during actual operation of a semiconductor device it may be rare that all of functional blocks 310 are fully activated simultaneously or that the phase of the current provided to functional blocks 310 is the same. Thus, in many cases, there is a large noise margin within which the power distribution network can operate.

Additionally, in many cases it may be desired to shut down a specific functional block 310 of a semiconductor device, or adjust the power delivered to one or more of functional blocks 310 individually, for example to make fine grained adjustments to the performance of a functional block 310. Here, it may be desirable to utilize an individual power distribution network with each functional block 310 of a semiconductor device.

Figure 6:
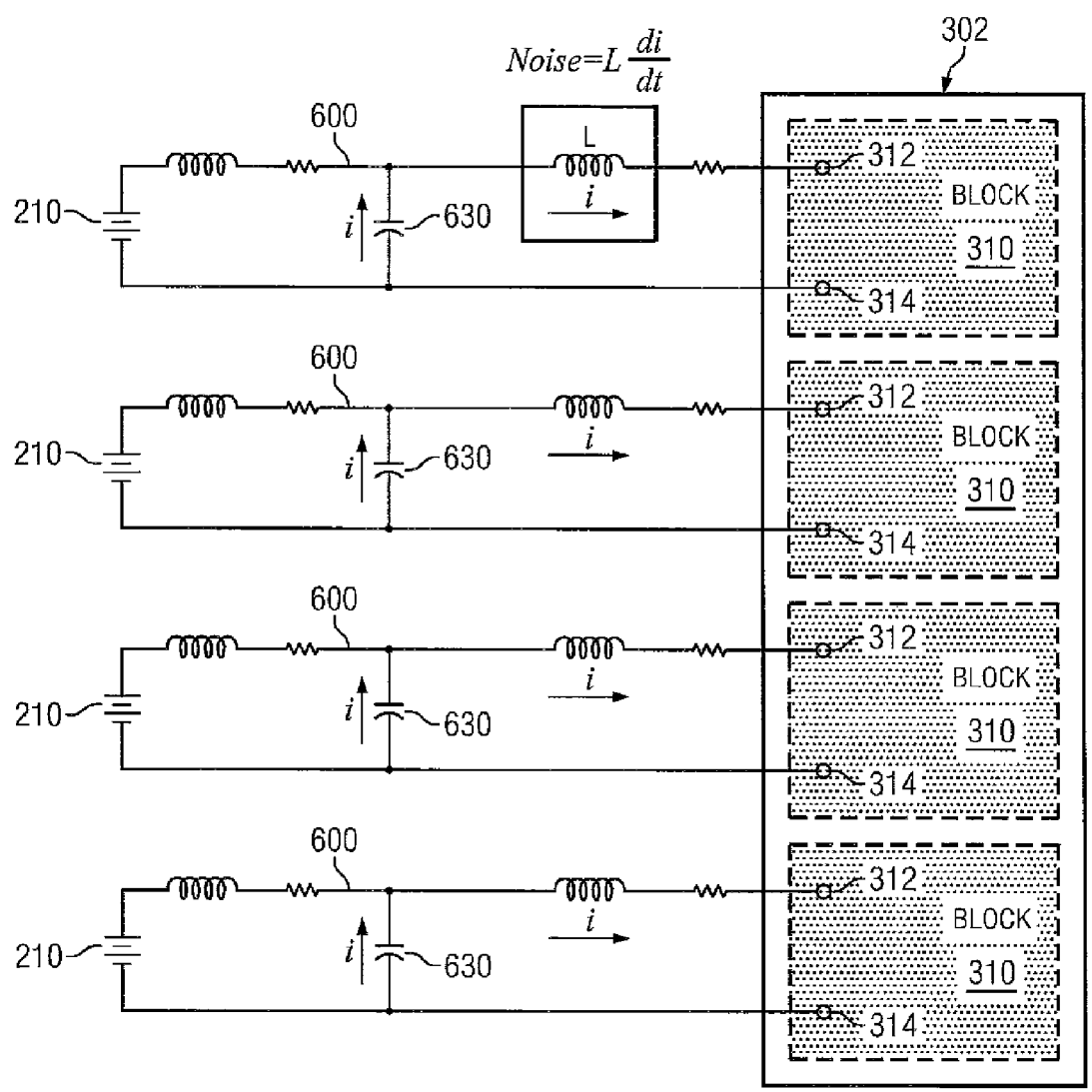
FIG. 6 depicts one embodiment of a power distribution network.

FIG. 6 depicts a diagram of one embodiment of a set of individual power distribution networks and a semiconductor device where one individual power distribution network may be utilized with one of a set of functional blocks. Semiconductor device 302 may comprise a semiconductor die (not shown) comprising functional logic blocks 310, for example processor cores. Each functional block 310 may be supplied power through a corresponding power distribution network 600. Each power distribution network 600 may have a corresponding functional block 310 which, in turn, may have one or more power couplings 312 and one or more ground couplings 314 such that the functional block 310 is coupled to a power source 210 of the power distribution network 600 through each of power couplings 312 and ground couplings 314. Each power distribution network 600 may also include one or more decoupling capacitors 630 coupled between power couplings 312 and ground couplings 314 of functional block 310 (e.g. a decoupling capacitor may be coupled between BGA balls 130 or vias of BGA balls 130 coupled to a power coupling 312 or a ground coupling 314 or may be coupled between lines in substrate 120 coupling power coupling 312 or ground coupling 314 of functional block 310 of die 110 to vias of BGA balls, etc.). In this case, a majority of AC power for the operation of the functional block 310 may be from decoupling capacitor 630. Thus, each functional block 310 is coupled to its own corresponding power source 210 through its own corresponding power distribution network 600.

With respect FIG. 6, the switching noise generated during operation of each of power distribution networks 600 may correspond to the inductance presented between the decoupling capacitors 630 and functional block 310 of the power distribution network 600 (e.g. if the functional block 310 is activated). Here, when all functional blocks 310 are active, the switching noise generated by a power distribution network 600 is $$L\frac{di}{dt}$$

where L is the inductance presented between decoupling capacitors 630 and its corresponding functional block 310. Specifically, if current consumption in a functional block 310 changes from zero to di in time dt the switching noise of a power distribution network 600 is $$L\frac{di}{dt}$$

where L is the inductance presented between the decoupling capacitor 630 and functional blocks 310.

Figure 7:
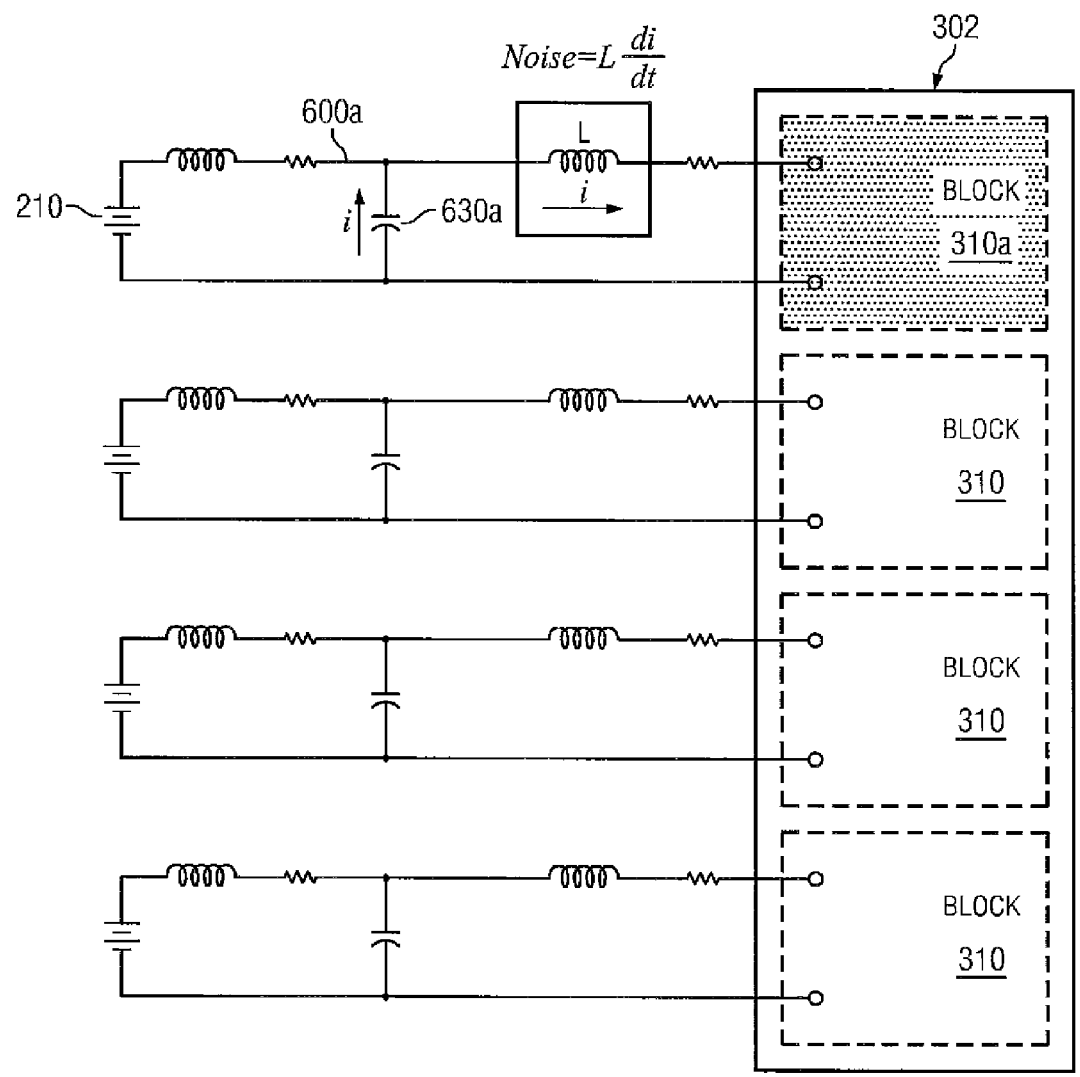
FIG. 7 depicts one embodiment of the power distribution network of FIG. 6 when one functional block is active.

In contrast to the power distribution network depicted with respect to FIGS. 3, 4 and 5, when only one functional block 310 is active the switching noise generated when supplying power to that functional block 310 will be substantially the same as supplying power to that functional block 310 when all functional blocks 310 are active. This contrast may be better depicted with reference to FIG. 7. Here, only one functional block 310a is active, but decoupling capacitor 630a may supply substantially all of the power needed by functional block 310a. Thus, the switching noise generated by power distribution network 600a when only one functional block 310a is active may also be $$L\frac{di}{dt}.$$

As discussed above, the case where one or more functional blocks of a semiconductor device are inactive, or drawing less than maximum power, occurs quite frequently during the operation of many semiconductor devices. Thus, it is desirable to generate less switching noise when fewer functional blocks 310 are active as is the case with the embodiments of power distribution networks depicted with respect to FIGS. 3, 4 and 5. Conversely, however, in many cases it is highly desirable to be able to individually provide and regulate power to each of a set of functional blocks of a semiconductor device as is provided by the power distribution networks depicted with respect to FIGS. 6 and 7, such that performance and efficiency of functional blocks may be increased during operation of the semiconductor device.

To address these conflicting desires and constraints, in many cases individual power distribution networks may be utilized with each functional block of a semiconductor device and an effort will be made to reduce the inductive components of package 100 and PCB 220. For example, more vias may be formed in substrate 120, and decoupling capacitors which have low inductive components may be utilized, etc. The vast majority of these types of solutions, however, are limited in their efficacy by the dual restrictions of area and cost which are commensurate with the manufacture of almost any semiconductor device. Additionally, in many cases providing each functional block with its own power distribution network may result in unacceptable direct current (DC) leakage within the set of these power distribution networks. Thus, it would be desirable to have a power distribution network which allows power to be regulated with respect to individual functional blocks of a semiconductor device, where such a power distribution network has low switching noise.

Attention is now directed to systems, methods and apparatuses for just such low noise power distribution networks for use with semiconductor devices. Embodiments of these systems and methods provide a power distribution network comprising a set of individual power distribution networks, each of the individual power distribution networks operable to provide power to a corresponding functional block of the semiconductor device. These individual power distribution networks may be coupled through capacitors between the power supplies or grounds of each individual power distribution network, such that the individual power distribution networks are coupled in a manner operable to pass AC current between them. As a result, switching noise of an individual power distribution network generated in conjunction with providing power to its corresponding functional block when it is active will be reduced when less than all the functional blocks coupled to the set of individual power distribution networks are active (relative to all the functional blocks being active).

Figure 8:
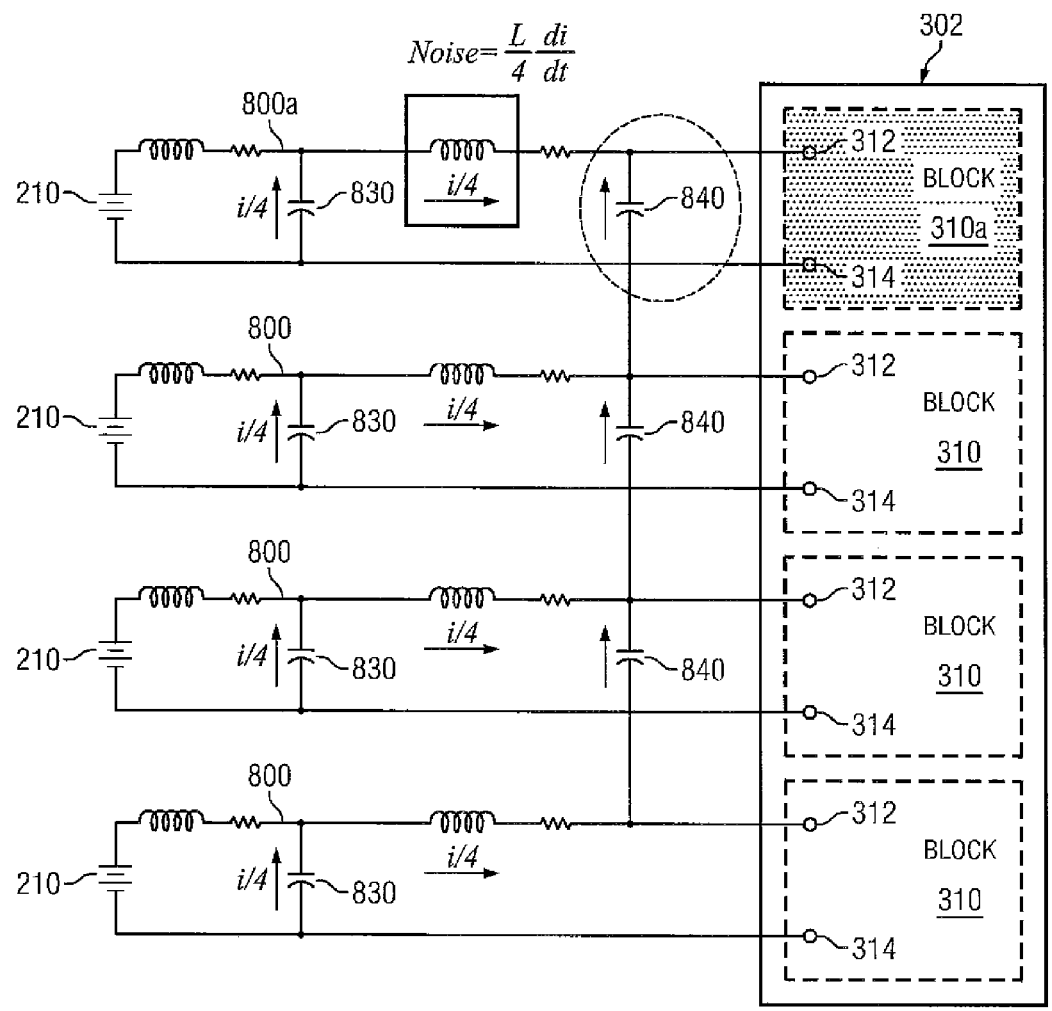
FIG. 8 depicts one embodiment of a power distribution network.

Turning now to FIG. 8, one embodiment of a power distribution network according to the present invention is depicted. Semiconductor device 302 may comprise functional logic blocks 310. Each functional block 310 may be supplied power through a corresponding individual power distribution network 800. With respect to each individual power distribution network 800, a corresponding functional block 310 may have one or more power couplings 312 and one or more ground couplings 314 such that the functional block 310 is coupled to a power source 210 of the individual power distribution network 800 through each of power couplings 312 and ground couplings 314. Each individual power distribution network 800 may also include one or more decoupling capacitors 830 coupled between power couplings 312 and ground couplings 314 of functional block 310 (e.g. a decoupling capacitor may be coupled between BGA balls 130 or vias of BGA balls 130 coupled to a power coupling 312 or a ground coupling 314, or may be coupled between lines in substrate 120 coupling power coupling 312 or ground coupling 314 of functional block 310 of die 110 to vias of BGA balls, etc.). Furthermore, each individual power distribution network 800 may be coupled through bypass capacitors 840. In one embodiment, these bypass capacitors 840 may couple individual power distribution networks 800 such that each bypass capacitor 840 couples a power line of one individual power distribution network 800 to a power line of another individual power distribution network 800 as shown in FIG. 8, while in other embodiments, bypass capacitors 840 may couple individual power distribution network 800 such that each bypass capacitor 840 couples a ground line of one individual power distribution network 800 to a ground line of another individual power distribution network 800.

As bypass capacitors 840 couple each of power supplies 210 of each individual power distribution network 800, these bypass capacitors are operable to pass AC current generated by the switching of each functional block 310, and allow power to be provided from all of decoupling capacitors 830 to any one of functional blocks 310.

Thus, when all functional blocks 310 are active, the switching noise generated by an individual power distribution network 800 will be $$L\frac{di}{dt}$$

where L is the inductance presented between decoupling capacitors 830 of the individual power distribution network 800 and its corresponding functional block 310. Specifically, if current consumption in a functional block 310 changes from zero to di in time dt the switching noise of an individual power distribution network 800 is $$L\frac{di}{dt}$$

where L is the inductance presented between the decoupling capacitor 830 and the functional block 310. In this case, a majority of AC power for the operation of the functional block 310 may be from decoupling capacitor 830 of the individual power distribution network 800 corresponding to the functional block 810.

When only one functional block 810 is active, however, current may still be passed from each of decoupling capacitors 830 to the active functional block 810a through bypass capacitors 840. Thus, every decoupling capacitor 830 may supply at least a portion of the power being supplied to functional block 310a through the bypass capacitor 840 coupling the individual power distribution network 800 to the individual power distribution network 800a corresponding to the active functional block 810a.

Assuming, in one particular instance, that each decoupling capacitor 830 is supplying approximately a fourth of the power $$\left(\text{e.g. }\frac{i}{4}\right)$$

being utilized by active functional block 810a, individual power distribution network 800a generates switching noise $$\frac{L}{4}$$

during operation. As can be seen then, with one active functional block 810a, individual power distribution network 800a generates approximately a fourth of the switching noise generated by power distribution network 800a when all functional blocks 810 are active. Additionally, as each functional block 810 is coupled to a corresponding individual power distribution network 800, power may be regulated solely with respect to the corresponding functional block 810 using that individual power distribution network 800, accomplishing both the goals of low noise and individually regulated power in a power distribution network.

As may be realized after a thorough perusal of the disclosure, decoupling capacitors 830 may be located in a variety of locations with respect to the individual power distribution networks 800. More specifically, portions of an individual power distribution network 800 may reside on PCB 220 (e.g. power supplies 210 or lines and planes in PCB carrying power to package 100), the package 100 (e.g. BGA balls, vias, planes or lines in the package carrying power to die 110), or die 110 (e.g. lines carrying power to functional blocks of the die 110). Bypass capacitors 840 coupling individual power distribution networks 800 may be placed almost anywhere along the individual power distribution networks 800, for example in PCB 220, package 100 or die 110.

Figure 9:
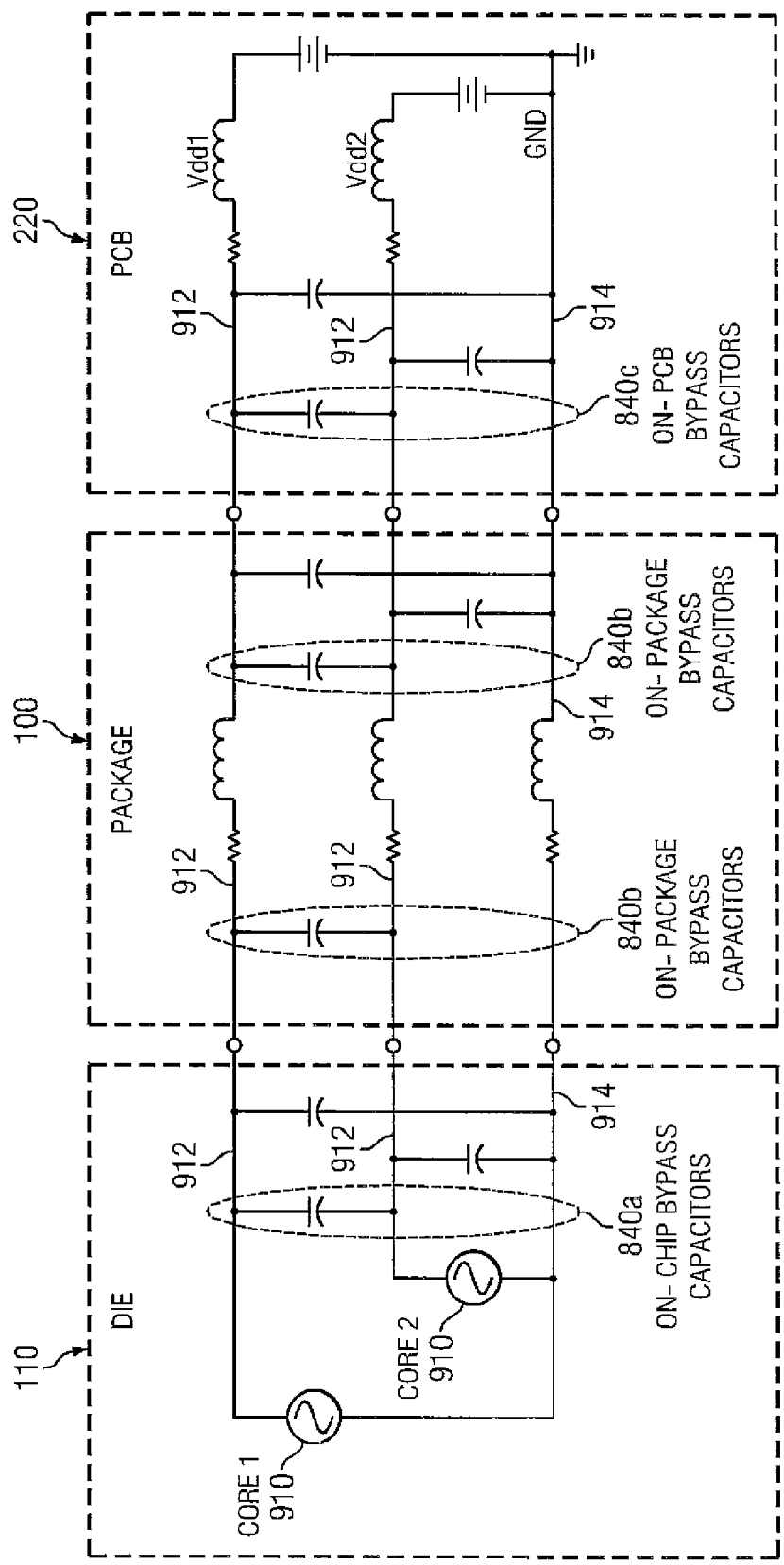
FIG. 9 depicts embodiments of the placement of bypass capacitors.

Turning to FIG. 9, a block diagram illustrating embodiments of locations for the placement of decoupling capacitors with respect to individual power networks which share a common ground is illustrated. As discussed earlier, die 110 may comprise a semiconductor device (e.g. chip) comprising a number of functional blocks such as processor cores 910. An individual power distribution network may comprise power lines 912 coupling each processor core 910 to corresponding power source 910, and a ground line 914 coupled to each of processor cores 910 and each of the power supplies 910 (e.g. a common ground for each of the individual power distribution networks).

Each of power line 912 and ground line 914 may comprise components of die 110, package 100 and PCB 220. In other words, a power line 912 (or ground line 914) may comprise traces of the semiconductor device of die 110, bumps on die 110, lines, traces or planes in package 110, vias of package 110, BGA balls of package 110, lines, traces or planes of PCB 220, etc. Bypass capacitor 840a may, in certain embodiments, may be on die 110, coupling power line 912 of one individual power distribution network in die 110 to another power line 912 of another power distribution network (e.g. bypass capacitor 840a may couple traces comprising each of power lines 912). In other embodiments, bypass capacitor 840b may, be on package 100, coupling power line 912 of one individual power distribution network in die 110 to another power line 912 of another power distribution network (e.g. bypass capacitor 840b may couple vias of package 100 comprising power lines 912). In still other embodiments, bypass capacitor 840c may be on PCB 220, coupling power line 912 of one individual power distribution network in PCB 220 to another power line 912 of another power distribution network (e.g. bypass capacitors may couple traces of PCB 220 comprising power lines 912).

Figure 10:
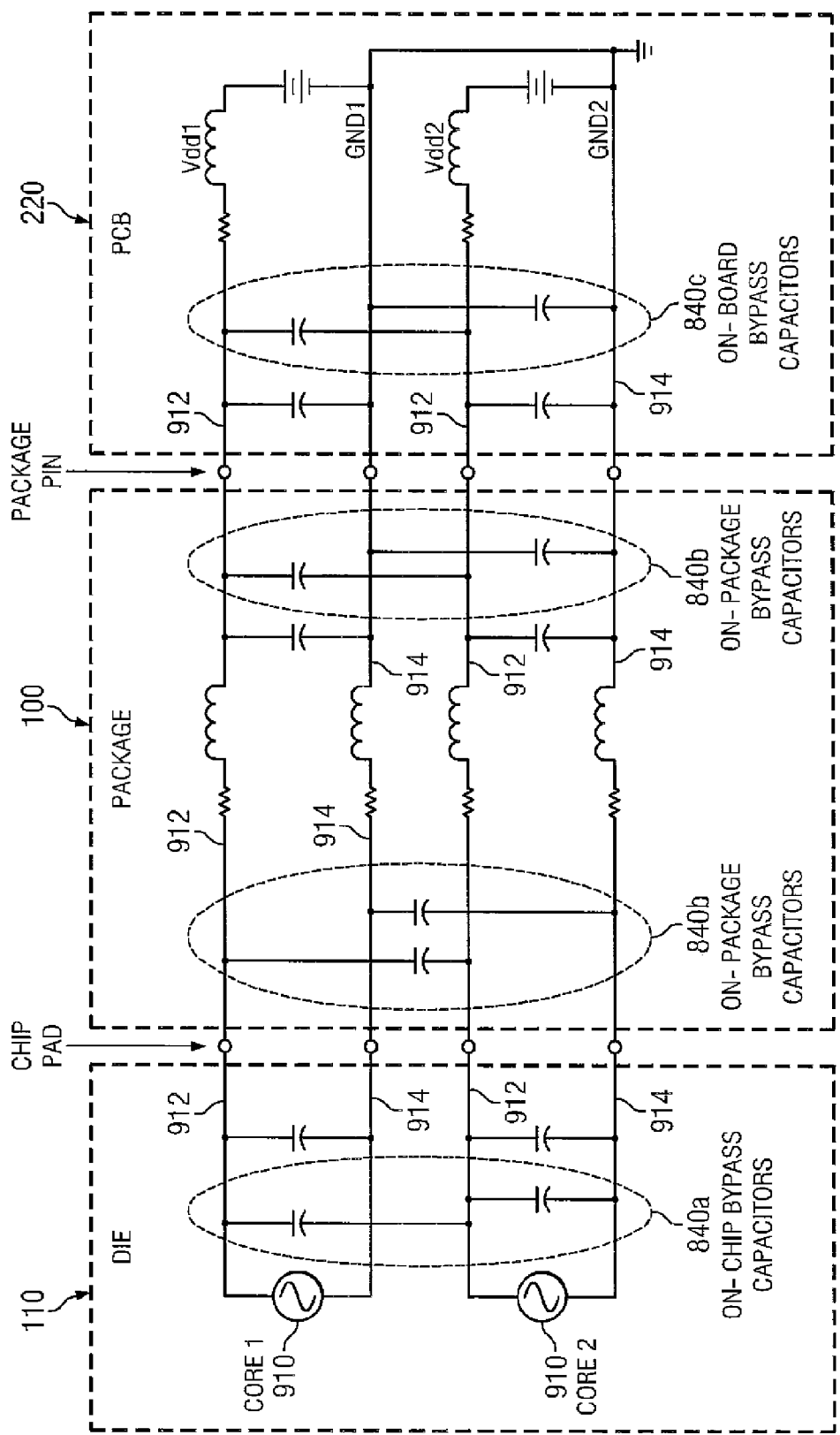
FIG. 10 depicts embodiments of the placement of bypass capacitors.

Moving to FIG. 10 a block diagram illustrating embodiments of locations for the placement of decoupling capacitors with respect to individual power networks is illustrated, where the individual power networks have individual ground lines. Again, die 110 may comprise a semiconductor device (e.g. chip) comprising a number of processor cores 910. An individual power distribution network may comprise power lines 912 coupling each processor core 910 to a corresponding power source, and a ground line 914 coupled to the processor cores 910 and a power supply 910.

Each of power lines 912 and ground lines 914 may comprise components of die 110, package 100 and PCB 220, as discussed above with respect to FIG. 9. Bypass capacitor 840a may, in certain embodiments, may be on die 110, coupling power line 912 of one individual power distribution network in die 110 to another power line 912 of another power distribution network or coupling ground line 914 of one individual power distribution network in die 110 to another ground line 914 of another power distribution network (e.g. bypass capacitors may couple traces comprising each of power lines 912, or ground lines 914). In other embodiments, bypass capacitor 840b may be on the package, coupling power line 912 of one individual power distribution network in die 110 to another power line 912 of another power distribution network or coupling ground line 914 of one individual power distribution network in die 110 to another ground line 914 of another power distribution network (e.g. bypass capacitors 840b may couple vias of package 110 comprising power lines 912 or ground lines 914). In still other embodiments, bypass capacitor 840c may, be on PCB 220, coupling power line 912 of one individual power distribution network in PCB 220 to another power line 912 of another power distribution network or coupling ground line 914 of one individual power distribution network in PCB 220 to another ground line 914 of another power distribution network (e.g. bypass capacitors may couple traces of PCB 220 comprising power lines 912 or ground lines 914).

It will be apparent after reading this disclosure that while various embodiments of the placement of bypass capacitors have been depicted, and multiple bypass capacitors depicted with respect to certain figures, other embodiments of the systems and methods of the present invention may comprise a single bypass capacitor coupling each pair of individual power distribution networks and that this bypass capacitor may be placed in almost any location, and may couple either power lines of individual distribution networks or ground lines of individual networks. Additionally, though individual power distribution networks have been associated with a corresponding power supply, it will be apparent that a single power supply may be associated with multiple power distribution networks, where the power supply is operable to provide appropriate power to each of the individual power distribution networks.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. An apparatus for delivering power to a semiconductor device, comprising:
    a set of individual power distribution networks, each individual power distribution network comprising a power supply and one or more decoupling capacitors coupled between a power line of the individual power distribution network and a ground line of the individual power distribution network and wherein each of the individual power distribution networks is coupled in parallel to a corresponding functional block of the semiconductor device; and
    one or more first bypass capacitors, wherein each of the set of individual power distribution networks is coupled to another of the set of individual power distribution networks by at least one of the one or more first bypass capacitors.

2. The apparatus of claim 1, wherein each of the corresponding functional blocks comprises substantially similar logic.

3. The apparatus of claim 2, wherein each of the functional blocks is a processor core.

4. The apparatus of claim 2, wherein the one or more first bypass capacitors couples a power line of each individual power distribution network to a power line of the another individual power distribution network.

5. An system for delivering power to a semiconductor device, comprising:
    a package comprising a semiconductor device having a set of functional blocks; a printed circuit board (PCB) coupled to the package;
    a power source coupled to the printed circuit board;
    a set of individual power distribution networks, each of the individual power distribution networks comprising a power supply and one or more decoupling capacitors coupled between a power line of the individual power distribution network and a ground line of the individual power distribution network and wherein each of the individual power distribution networks is coupled in parallel to a corresponding functional block and providing power from the power source to the corresponding functional block; and
    one or more first bypass capacitors, wherein each of the set of individual power distribution networks is coupled to another of the set of individual power distribution networks by at least one of the one or more first bypass capacitors.

6. The system of claim 5, wherein each of the set of individual power distribution networks comprises a portion of the PCB, a portion of the package and a portion of the semiconductor device.

7. The system of claim 6, wherein each of the functional blocks are substantially identical processor cores.

8. The system of claim 6, wherein the one or more first bypass capacitors are comprised by the package, the PCB or the semiconductor device.

9. The system of claim 8, wherein the one or more first bypass capacitors couples a power line of each individual power distribution network to a power line of the another individual power distribution network.

* * * * *